United States Patent
Ko et al.

(10) Patent No.: US 8,072,052 B2
(45) Date of Patent: Dec. 6, 2011

(54) TRENCH SUBSTRATE

(75) Inventors: Young Gwan Ko, Seoul (KR); Ryoichi Watanabe, Gyunggi-do (KR); Sang Soo Lee, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 111 days.

(21) Appl. No.: 12/463,945

(22) Filed: May 11, 2009

(65) Prior Publication Data

US 2010/0264549 A1    Oct. 21, 2010

(30) Foreign Application Priority Data

Apr. 16, 2009   (KR) .................. 10-2009-0033216

(51) Int. Cl.
*H01L 23/495* (2006.01)
(52) U.S. Cl. ................. 257/668; 257/E23.036
(58) Field of Classification Search .......... 257/774, 257/E23.011, E21.599, E21.577, 668, E23.036, 257/E21.524; 438/460, 666
See application file for complete search history.

(56) References Cited

U.S. PATENT DOCUMENTS

2002/0192902 A1 * 12/2002 Kimura et al. ............ 438/253

FOREIGN PATENT DOCUMENTS

| JP | 2002-171048 | 6/2002 |
| KR | 1020090020208 A | 2/2009 |
| WO | WO-03/019641 | 3/2003 |

OTHER PUBLICATIONS

Office Action from counterpart Korean Patent Application No. 10-2009-0033216, mailed Nov. 3, 2010, 3 pages.
Office Action from counterpart Japanese Patent Application No. 2009-115606, mailed Jul. 5, 2011, 4 pages.

* cited by examiner

*Primary Examiner* — Thomas L Dickey
*Assistant Examiner* — Nikolay Yushin
(74) *Attorney, Agent, or Firm* — Blakely, Sokoloff, Taylor & Zafman, LLP

(57) ABSTRACT

Disclosed herein are a trench substrate and a method of manufacturing the same. The trench substrate includes a base substrate, an insulating layer formed on one side or both sides of the base substrate and including trenches formed in a circuit region and a dummy region positioned at a peripheral edge of the trench substrate, and a circuit layer formed in the trenches of the circuit region through a plating process and including a circuit pattern and vias. Thanks to formation of the trenches in the dummy region and the cutting region, deviation in thickness of a plating layer formed on the insulating layer in a plating process is improved upon.

8 Claims, 18 Drawing Sheets

TRENCH SUBSTRATE

CROSS REFERENCE TO RELATED APPLICATION

This application claims the benefit of Korean Patent Application No. 10-2009-0033216, filed Apr. 16, 2009, entitled "A trench substrate and a fabricating method the same", which is hereby incorporated by reference in its entirety into this application.

BACKGROUND OF THE INVENTION

1. Field of the Invention

The present invention relates to a trench substrate and a method of manufacturing the same.

2. Description of the Related Art

Recently, in response to the densification of semiconductor chips and the increase in signal transmission rate, there is an increasing demand for a technology for the direct mounting of a semiconductor chip onto a printed circuit board. Accordingly, the development of a highly compact and reliable printed circuit board capable of accommodating the densification of semiconductor chips is being intensively required.

Requirements for such a highly compact and reliable printed circuit board are closely related to specifications of the semiconductor chips, and fulfillment of the requirements encounters numerous tasks such as realizing fine circuits, high electrical properties, structures enabling a high signal transmission rate, high reliability and high performance. To satisfy these requirements, a technology of creating fine circuit patterns and micro via-holes on printed circuit boards is of the utmost importance.

Typical processes of forming a circuit pattern on a printed circuit board may include a subtractive process, a full additive process, a semi-additive process and the like. Among these processes, the semi-additive process which is capable of achieving a fine circuit pattern is attracting many people's attention.

FIGS. 1 to 6 are cross-sectional views sequentially showing a conventional semi-additive process of forming a circuit pattern. The semi-additive process of forming a circuit pattern will now be described with reference to the drawings.

As shown in FIG. 1, a via-hole 16 is first formed in an insulating layer 12 which includes a metal layer 14 on one side thereof.

As shown in FIG. 2, an electroless plating layer 18 is formed on the insulating layer 2 and the internal surface of the via-hole 16 formed in the insulating layer 12. In this regard, the electroless plating layer 18 serves as a pretreatment layer for a subsequent electrolytic plating process, and must have or exceed a predetermined thickness (for example, 1 µm or more) in order to allow an electrolytic plating layer 24 to be formed thereon in the subsequent process.

As shown in FIG. 3, a dry film 20 is applied onto the electroless plating layer 18, and is then patterned to form openings 22 through which a region for formation of a circuit pattern is exposed.

As shown in FIG. 4, the electrolytic plating layer 24 is formed in both the via-hole 16 and the openings 22.

As shown in FIG. 5, the dry film 20 is removed.

Finally, as shown in FIG. 6, the region of the electroless plating layer 18 which is not covered with the electrolytic plating layer 24 is eliminated using flash etching, quick etching and the like, thus providing a circuit pattern 28 that includes a via 26.

However, since the circuit pattern 28, which is manufactured using the conventional semi-additive process, is configured into a raised structure on the insulating layer 12, the circuit pattern 28 is apt to separate from the insulating layer 12. In particular, in response to the recent trend of the circuit pattern 28 becoming fine, a bonding area between the insulating layer 12 and the circuit pattern 28 is decreased and thus adhesive force acting therebetween is decreased, resulting in the easy separation of the circuit pattern 28.

These days, new processes which are designed to overcome these limitations are proposed. Above all, an LPP (Laser Patterning Process) in which a trench is formed using laser machining and then a circuit pattern is formed through plating, polishing and etching processes is attracting many people's attention.

FIGS. 7 to 10 are cross-sectional views sequentially showing another conventional process of forming a circuit pattern through an LPP. The process of forming a circuit pattern will now be described with reference to the drawings.

As shown in FIG. 7, trenches 56 including a circuit pattern trench 56a and a via trench 56b are formed on an insulating layer 52 that includes a metal layer 54 layered on one side thereof.

As shown in FIG. 8, an electroless plating layer 58 is formed on both the internal surface of the trench 56 and the insulating layer 52.

As shown in FIG. 9, an electrolytic plating layer 60 is formed on the electroless plating layer 58.

Finally, as shown in FIG. 10, the upper portions of the electroless plating layer 58 and the electrolytic plating layer 60, which protrude from the insulating layer 52, are removed through etching and polishing processes, thus creating an embedded circuit pattern 64 that includes a via 62.

From FIG. 9, it will be appreciated that the electrolytic plating layer 60, which is formed in the trenches 56 and on the insulating layer 52, has a difference (plating deviation) between a height at the trench 56 and a height at a region other than the trench 56. For this reason, even though the upper portions of the electroless plating layer 58 and the electrolytic plating layer 60, which protrude from the insulating layer 52, are removed through an etching or polishing process, there is a limit to the fulfillment of an even surface regardless of regions.

In particular, because the portion of the electrolytic plating layer 60 which is positioned at a region other than the trench 56 protrudes upward from the insulating layer 52 more than the portion of electrolytic plating layer 60 which is positioned at the trench 56, the portion of the electrolytic plating layer 60 formed on the insulating layer 52 is not thoroughly removed, and thus adjacent lines of the circuit pattern 64 are not separated from each other. Meanwhile, when the electrolytic plating layer 60 is excessively removed, all the electrolytic plating layer 60 in the circuit pattern 64 and the via 62 are completely removed.

SUMMARY OF THE INVENTION

Accordingly, the present invention has been made keeping in mind the above problems occurring in the related art, and the present invention provides a trench substrate and a method of manufacturing the same, which is capable of reducing deviations in the plating.

In a first aspect, the present invention provides a trench substrate including: a base substrate; an insulating layer formed on one side or both sides of the base substrate and including trenches formed in a circuit region and a dummy region positioned at a peripheral edge of the trench substrate;

and a circuit layer formed in the trenches of the circuit region through a plating process and including a circuit pattern and vias.

The trench substrate may further including: an outer insulating layer formed both on the trenches formed in the dummy region positioned at the peripheral edge of the trench substrate and on the insulating layer.

The trenches formed in the dummy region positioned at the peripheral edge of the trench substrate may have a linear shape, a circular shape, a triangular shape, a square shape, a cross shape or a polygonal shape.

The trenches formed in the dummy region positioned at the peripheral edge of the trench substrate may be of an incised form with or without a protrusion therein.

In another aspect, the present invention provides a trench substrate including: a base substrate; a first insulating layer formed on one side of the base substrate and including trenches formed in both a circuit region and a dummy region positioned at a peripheral edge region of the trench substrate; a second insulating layer formed on the other side of the base substrate and including via-holes formed in the circuit region; a first circuit layer including a circuit pattern and vias, the circuit pattern and the vias being formed in the trench in the circuit region of the first insulating layer; and a second circuit layer including vias formed in the second insulating layer.

The trench substrate may further include: a first outer insulating layer formed both in the trenches formed in the dummy region positioned at the peripheral edge region of the trench substrate and on the first insulating layer; and a second outer insulating layer formed on the second insulating layer.

The trenches formed in the dummy region positioned at the peripheral edge of the trench substrate may have a linear shape, a circular shape, a triangular shape, a square shape, a cross shape or a polygonal shape.

The trenches formed in the dummy region positioned at the peripheral edge of the trench substrate may be of an incised form with or without a protrusion therein.

In a further aspect, the present invention provides a method of manufacturing a trench substrate, including: (A) forming trenches in a circuit region, a dummy region positioned at a peripheral edge region of the trench substrate and a cutting region, all of which are defined on an insulating layer formed on one side or both sides of a base substrate; (B) forming a plating layer both in the trenches and on the insulating layer; (C) removing a surplus portion of the plating layer formed on the insulating layer; and (D) applying etching resist onto the circuit region, removing the plating layer formed in the dummy region positioned at the peripheral edge region of the trench substrate and the cutting region, and removing the etching resist.

The method may further include: after (D) removing the etching resist, (E) separating the trench substrate from a trench panel by executing a dicing process along the cutting region.

The method may further include: after (D) removing the etching resist, (E) forming an outer insulating layer both in the trenches formed in the dummy region positioned at the peripheral edge region of the trench substrate and on the insulating layer.

In (A) forming the trenches, the trenches formed in the dummy region positioned at the peripheral edge of the trench substrate and the cutting region may have a linear shape, a circular shape, a triangular shape, a square shape, a cross shape or a polygonal shape.

In (A) forming the trenches, the trenches formed in the dummy region positioned at the peripheral edge of the trench substrate and the cutting region may be of an incised form with or without a protrusion therein.

In still another aspect, the present invention provides a method of manufacturing a trench substrate, including; (A) forming a first insulating layer on one side of a base substrate and forming a second insulating layer on the other side of the base substrate; (B) forming trenches on the first insulating layer in a circuit region of the first insulating layer, a dummy region positioned at a peripheral edge region of the trench substrate and a cutting region, and forming via-holes on the second insulating layer in the circuit region; (C) forming a first plating layer both in the trenches and on the first insulating layer and forming a second plating layer both in the via-holes and on the second insulating layer; (D) removing a surplus portion of the first plating layer formed on the first insulating layer; (E) applying a first etching resist onto the first insulating layer in the circuit region and applying a second etching resist having an opening for formation of a circuit onto the second insulating layer; and (F) removing the first plating layer formed on the first insulating layer in the dummy region and the cutting region and a portion of the second plating layer exposed through the opening for formation of a circuit, and removing the first and second etching resists.

The method may further include: after (F) removing the first and second etching resists, (G) separating the trench substrate from a trench panel by executing a dicing process along the cutting region.

The method may further include: after (F) removing the first and second etching resists, (G) forming a first outer insulating layer both in the trenches formed on the first insulating layer in the dummy region positioned at the peripheral edge region of the trench substrate and on the first insulating layer, and forming a second outer insulating layer on the second insulating layer.

In (B) forming the trenches, the trenches formed in the dummy region positioned at the peripheral edge of the trench substrate and the cutting region may have a linear shape, a circular shape, a triangular shape, a square shape, a cross shape or a polygonal shape.

In (B) forming the trenches, the trenches formed in the dummy region positioned at the peripheral edge of the trench substrate and the cutting region may be of an incised form with or without a protrusion therein.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
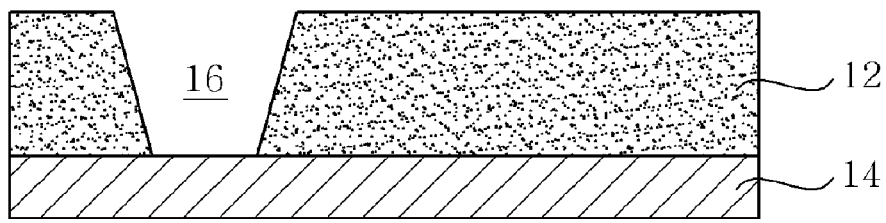
FIGS. 1 to 6 are cross-sectional views sequentially showing a conventional semi-additive process of forming a circuit pattern.
Figure 2:
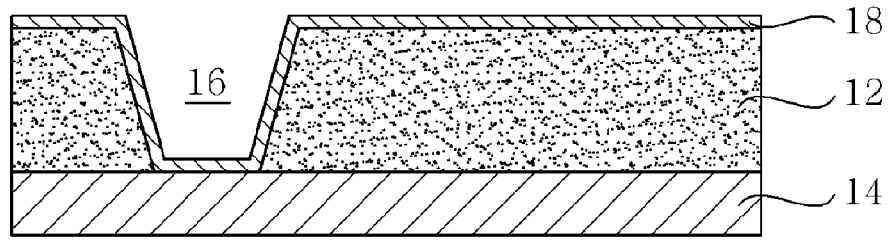
Figure 3:
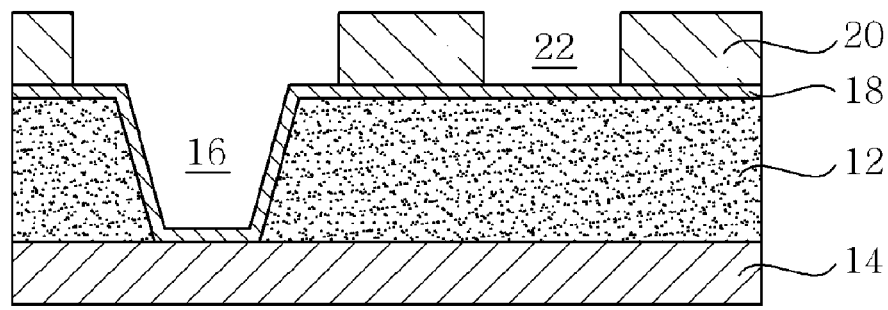
Figure 4:
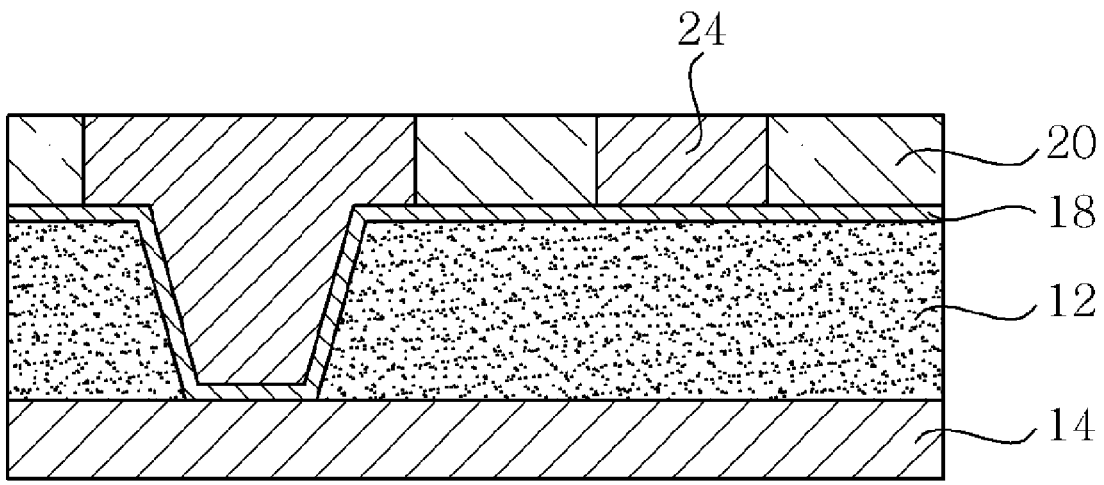
Figure 5:
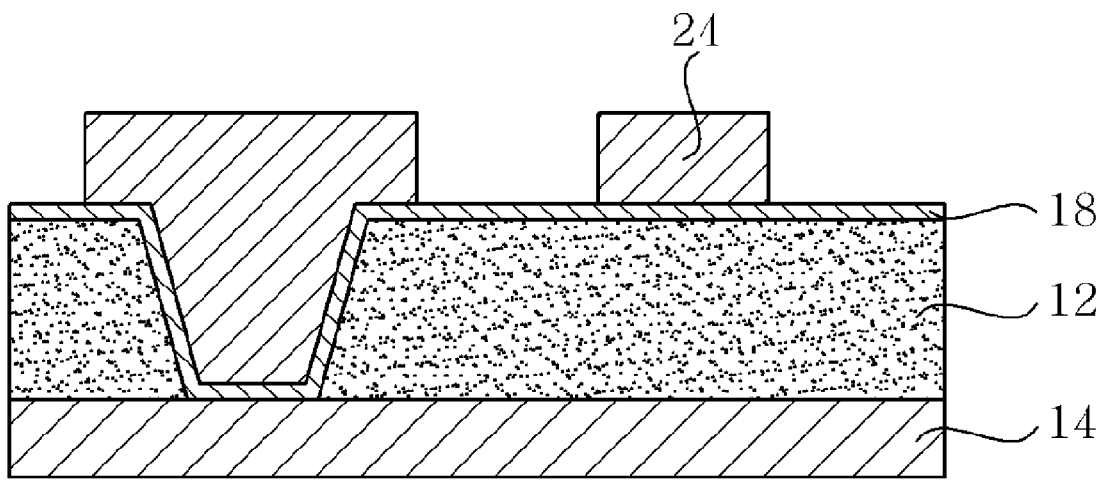
Figure 6:
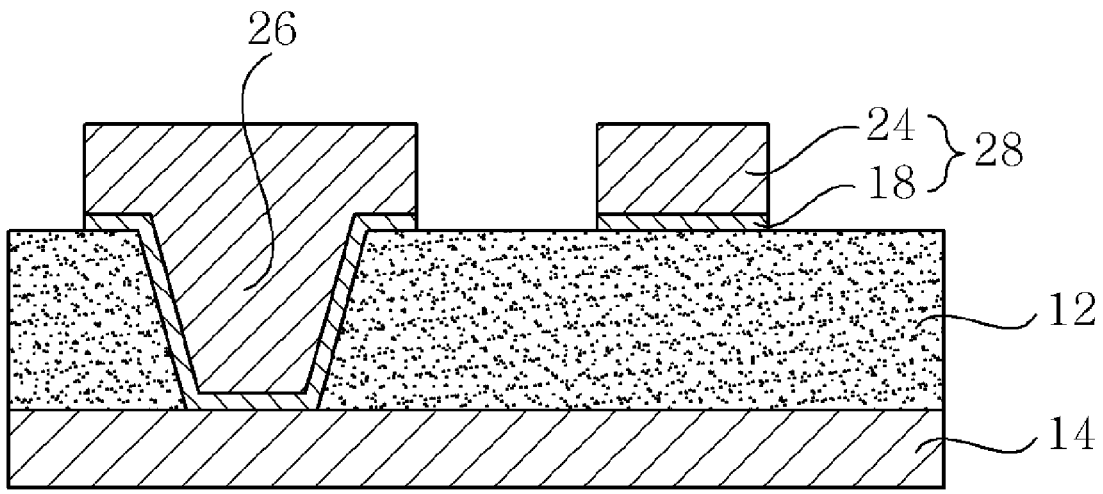
Figure 7:
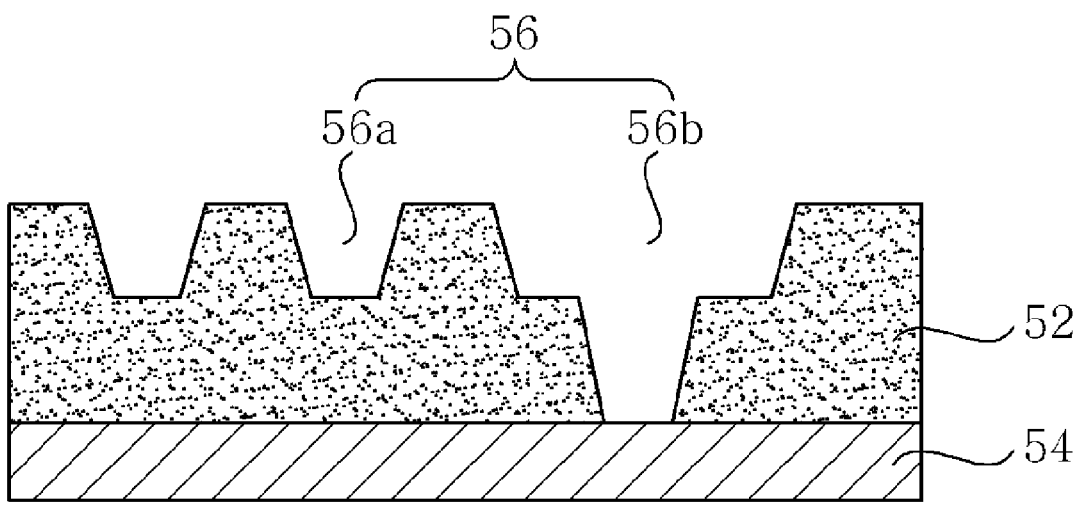
FIGS. 7 to 10 are cross-sectional views sequentially showing another conventional process of forming a circuit pattern through an LPP.
Figure 8:
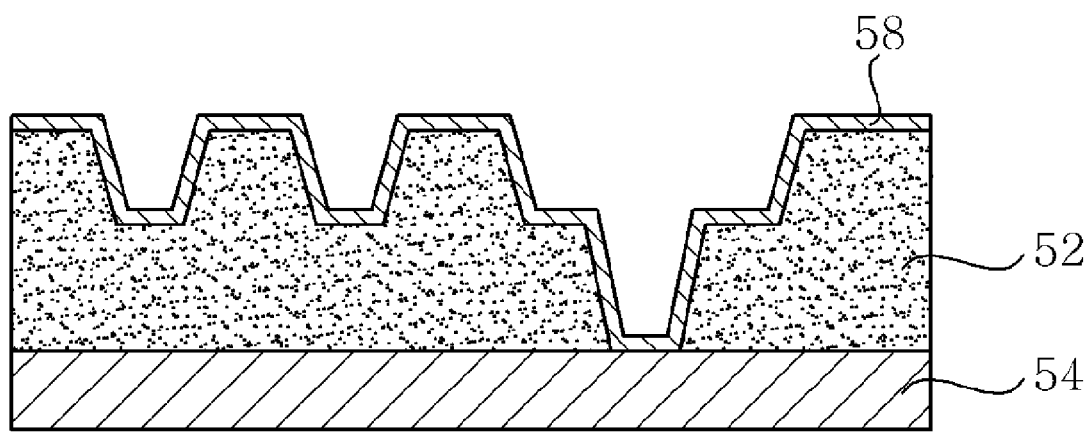
Figure 9:
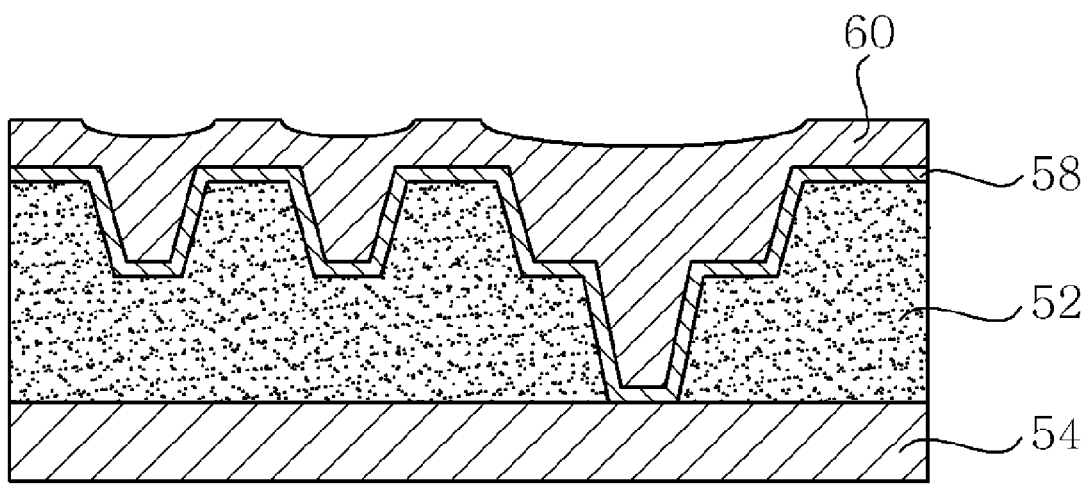
Figure 10:
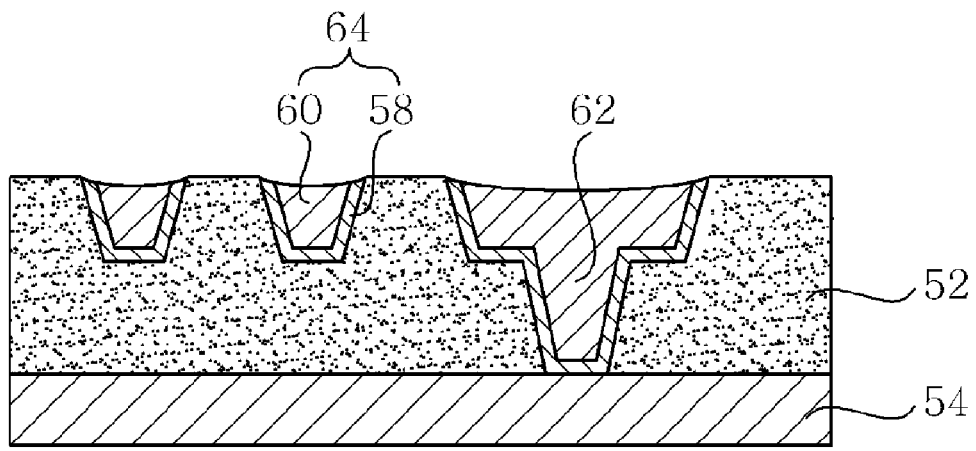

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to best describe the method he or she knows for carrying out the invention.

With regards to the designation of reference numerals, it should be noted that the same reference numerals are used throughout the different drawings to designate the same or similar components. Also, in the description of the present invention, when it is considered that the detailed description of a related art may obscure the gist of the present invention, such a detailed description may be omitted.

Hereinafter, embodiments of the present invention will be described in greater detail with reference to the accompanying drawings.

Structure of a Trench Substrate (First Embodiment)

Figure 11:
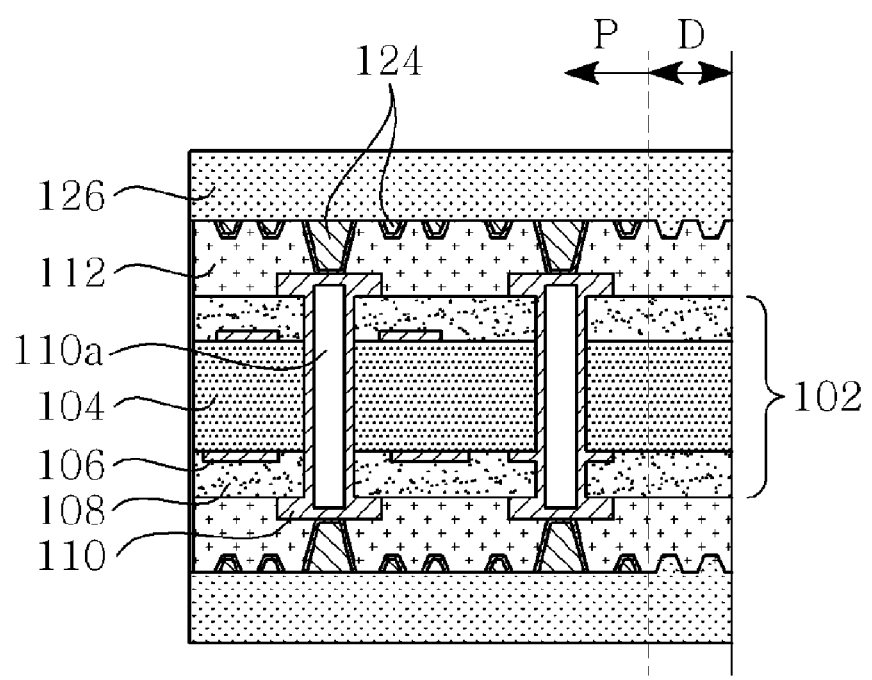
FIG. 11 is a cross-sectional view of a trench substrate according to a first embodiment of the present invention.

FIG. 11 is a cross-sectional view of a trench substrate according to a first embodiment of the present invention. Hereinafter, the trench substrate 100a according to this embodiment of the present invention is described in detail.

As shown in FIG. 11, the trench substrate 100a according to this embodiment of the present invention comprises a base substrate 102, an insulating layer 112 formed on one side or both sides of the base substrate 102 and having trenches 114a and 114b formed on a circuit region P and a dummy region D that is positioned at a peripheral edge region of the trench substrate, and a circuit layer 124 including a circuit pattern and vias which are formed in the trenches 114a and 114b residing in the circuit region P through a plating process.

The base substrate 102 comprises a core insulating layer 104 which includes core circuit layers 106 formed on both sides thereof, and inner insulating layers 108 each of which includes an inner circuit layer 110 formed on an outer side thereof. The inner circuit layers 110 are connected to each other via an inner via 110a penetrating through the core insulating layer 104 and the inner insulating layer 108. It will be obvious that the structure of the base substrate 102 shown in FIG. 11 is only illustrative and any of various structures may be adopted in the present invention.

The insulating layer 112 is formed on the base substrate 102 and includes trenches 114a and 114b formed in the circuit region P and the peripheral edge dummy region D. Each of the trenches 114a and 114b include first trenches 114a which are formed in the circuit region P of the insulating layer 112 for the formation of a circuit pattern and vias, and second trenches 114b which are formed in the dummy region D positioned at the peripheral edge of the insulating layer 112 for the improvement of plating deviation. In this regard, the second trenches 114b are formed in the dummy region D positioned at the peripheral edge region of the substrate product in order to improve deviation of plating. At this point, for the purpose of the optimal improvement of deviation of plating, the second trenches 114b may have any appropriate shape, diameter, interval, depth and the like. This will be described in greater detail in the subsequent texts with reference being made to FIGS. 31a and 31b and FIGS. 32a and 32b.

The second trenches 114 may be formed into a uniformly even and incised shape over the entire length thereof, or may be formed into a non-uniformly incised shape which has trenches including protrusions remaining therein. More specifically, when the second trenches 114b are configured to have a relatively large diameter, the wide trenches are provided therein with protrusions, so that the plating layer having an even thickness can be formed over the entire length of the trenches.

The circuit layer 124 is formed in the first trenches 114a in the circuit region P excluding the second trenches 114b in the same dummy region D through a plating process. As a result, the plating process is executed in the first trenches 114a, thus forming the circuit layer 124 including the circuit pattern and vias.

Meanwhile, an outer insulating layer 126 is formed on the insulating layer 112 and the second trenches 114b which are formed in the dummy region D. In this context, the outer insulating layer 126 should be understood as including either a solder resist layer or a multilayered buildup layer.

Furthermore, although the trench substrate is illustrated in FIG. 11 as being of a configuration such that the base substrate 102 is provided at both sides thereof with trench circuits, a trench substrate which is configured such that the trench circuit is formed only on one side of the base substrate 102 should be understood as falling within the scope of the present invention.

Structure of a Trench Substrate (Second Embodiment)

Figure 12:
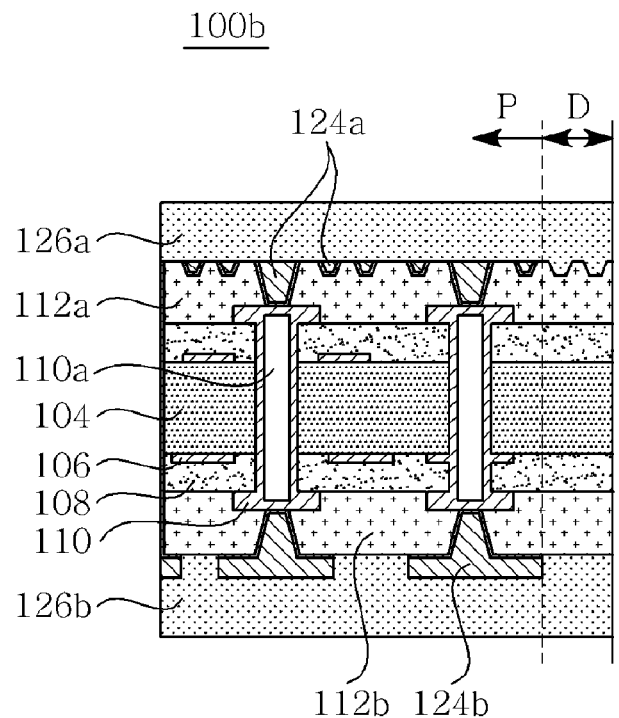
FIG. 12 is a cross-sectional view of a trench substrate according to a second embodiment of the present invention.

FIG. 12 is a cross-sectional view of a trench substrate according to a second embodiment of the present invention. Hereinafter, the trench substrate 100b according to this embodiment of the present invention is described in detail.

As shown in FIG. 12, the trench substrate 100b according to this embodiment of the present invention comprises a base substrate 102, a first insulating layer 112a formed on one side of the base substrate 102 and having trenches 114a and 114b formed on a circuit region P and a dummy region D that is positioned at a peripheral edge region of the trench substrate, a second insulating layer 112b formed on the other side of the base substrate 102 and having via-holes 114c formed on the circuit region P, a first circuit layer 124a including a circuit pattern and vias which are formed in the trenches 114a residing in the circuit region P of the first insulating layer 112a, and a second circuit layer 124b having vias which are formed in the second insulating layer 112b.

In other words, according to this embodiment, a trench pattern, which has the same configuration as that of the first embodiment, is formed on one side of the base substrate 102, and a typical circuit layer is formed on the other side of the base substrate 102. The other details of this trench substrate 100b according to this embodiment are substantially identical to those of the first embodiment, and thus redundant descriptions thereof are omitted herein.

Process of Manufacturing the Trench Substrate (First Embodiment)

FIGS. 13 through 21 are cross-sectional views sequentially showing a process of manufacturing a trench substrate according to a first embodiment of the present invention. Hereinafter, the process of manufacturing the trench substrate according to the first embodiment of the present invention will be described with reference to the drawings.

Figure 13:
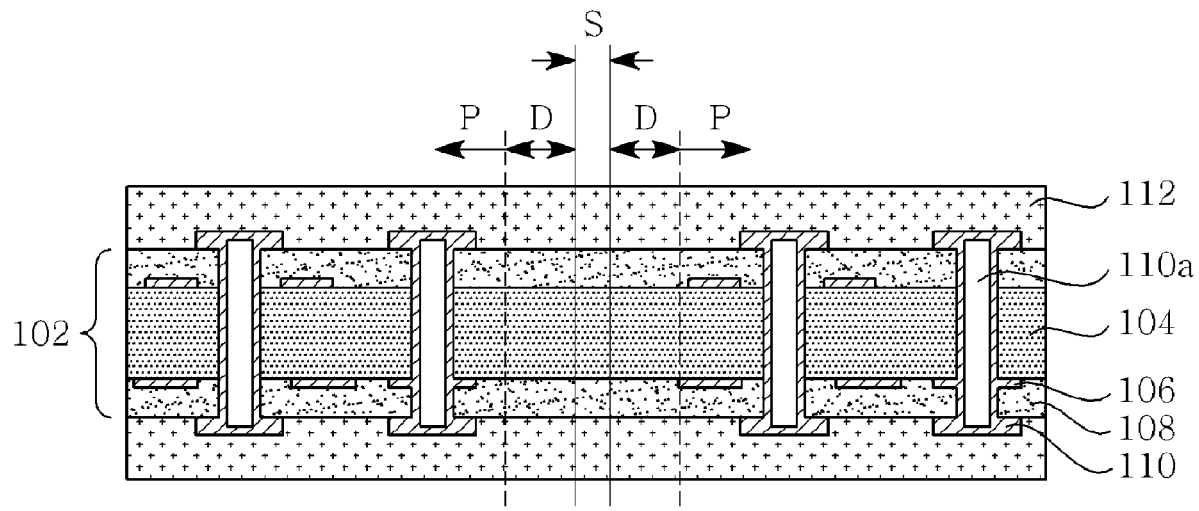
FIGS. 13 through 21 are cross-sectional views sequentially showing a process of manufacturing a trench substrate according to a first embodiment of the present invention.

As shown in FIG. 13, insulating layers 112 are formed on both sides of a base substrate 102.

At this point, the base substrate 102 is illustrated in FIG. 13 as being configured such that inner insulating layers 108 each of which includes an inner circuit layer 110 are formed on both sides of a core insulating layer 104 which includes a core circuit layer 106 formed on each of both sides thereof, and the inner circuit layers 110 are connected to each other via inner vias 110a penetrating through the core insulating layer 104 and the inner insulating layers 108. However, the configuration shown in FIG. 13 is merely illustrative not exclusive. For example, the base substrate 102 may be used as an insulating layer. In this case, a subsequent process may proceed without using a process of forming an additional insulating layer.

Furthermore, although FIG. 13 illustrates a configuration in which insulating layers 112 are formed on both sides of the base substrate 102, any other configuration, in which the insulating layer 112 is formed on only one side of the base substrate 102 and then a subsequent process proceeds, should be understood as falling within the scope of the present invention. Hereinafter, an exemplary process of manufacturing the trench substrate in such a way that the insulating layers 112 are formed on both sides of the base substrate 102 will be described for the sake of brief description and illustration.

Figure 14:
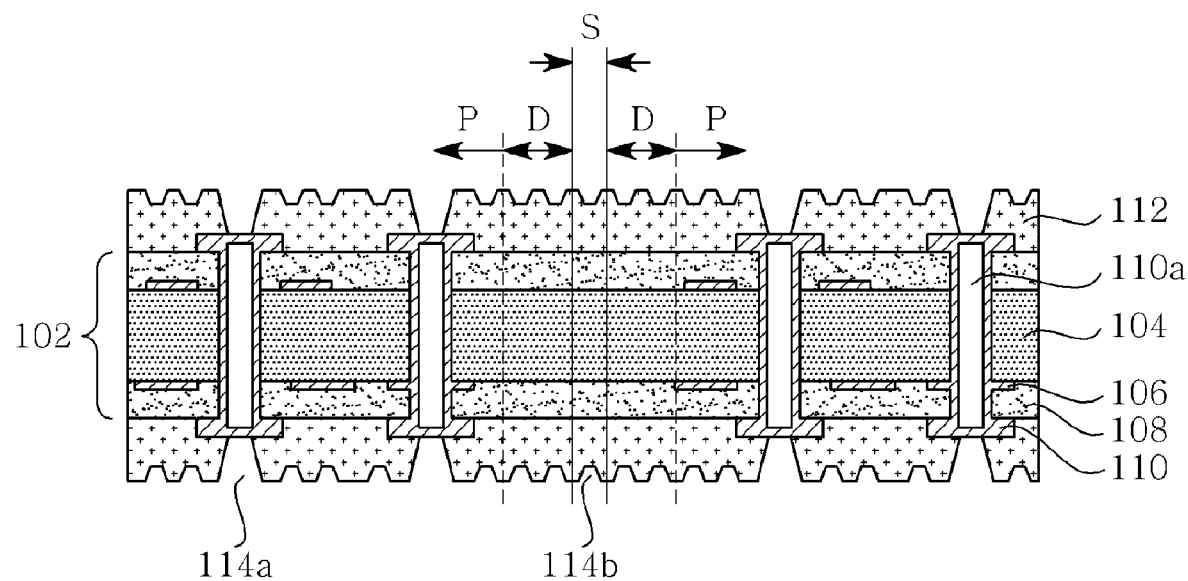

As shown in FIG. 14, trenches 114a and 114b are formed on the insulating layers 112 formed on the base substrate 102 in a circuit region P, a dummy region D positioned at the peripheral edge region of the resulting product and a cutting region S positioned between the resulting products. In this regard, the cutting region S refers to a region defined between a plurality of unit trench substrates which are included in a panel and along which the panel is cut into individual unit trench substrates using a dicing process.

The trenches 114a and 114b include first trenches 114a which are formed on the insulating layers 112 in the circuit region P for the formation of circuit patterns and vias, and second trenches 114b formed on the insulating layers 112 in the dummy region D and the cutting region S for the improvement of plating deviation.

Although the trenches 114a and 114b may be formed using any technology known in the art, they are formed using an imprint lithography or a technology which uses a laser (e.g., Nd-YAG (Neodymium-doped Yttrium Aluminum Garnet) laser, $CO_2$ laser, pulse ultra-violet excimer laser) in this embodiment.

Figure 15:
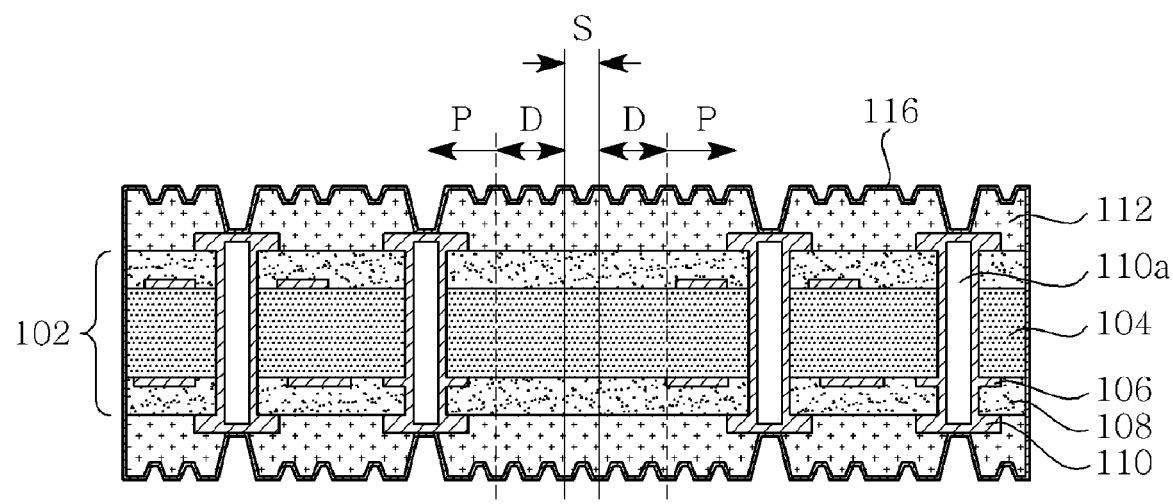

Subsequently, as shown in FIG. 15, electroless plating layers 112 are formed on both the internal surfaces of the trenches 114a and 114b and the insulating layers 112.

At this point, the electroless plating layers 116 are formed in such a manner that a catalyst is adsorbed on the surfaces of the insulating layers 112 and a component of electroless plating solution accepts electrons from a reducing agent and then precipitates copper.

In the formation of the electroless plating layers, the adsorption of the catalyst is conducted in the following sequence: a cleaner-conditioner procedure→a preliminary catalytic treatment→catalytic treatment→catalytic reduction. The cleaner-conditioner procedure is conducted so as to remove organic substances remaining on the insulating layers 112 thus improving wettability and to decrease a surface tension using surfactant thus allowing water-soluble chemicals to easily adhere to the internal surfaces of the insulating layers 112. The preliminary catalytic treatment is conducted so as to immerse the insulating layers 112 in catalytic chemicals present in low concentration (typically, catalytic chemicals are diluted to a concentration of 1-3%) prior to the catalytic treatment thus preventing the chemicals used in the catalytic treatment from being contaminated or from being varied in the concentration. The catalytic treatment is conducted so as to coat the insulating layers 112 with catalytic particles such as Pd—Sn or a Pd ionic complex compound. The catalytic reduction is conducted so as to obtain Pd metal serving as an actual catalyst.

Figure 16:
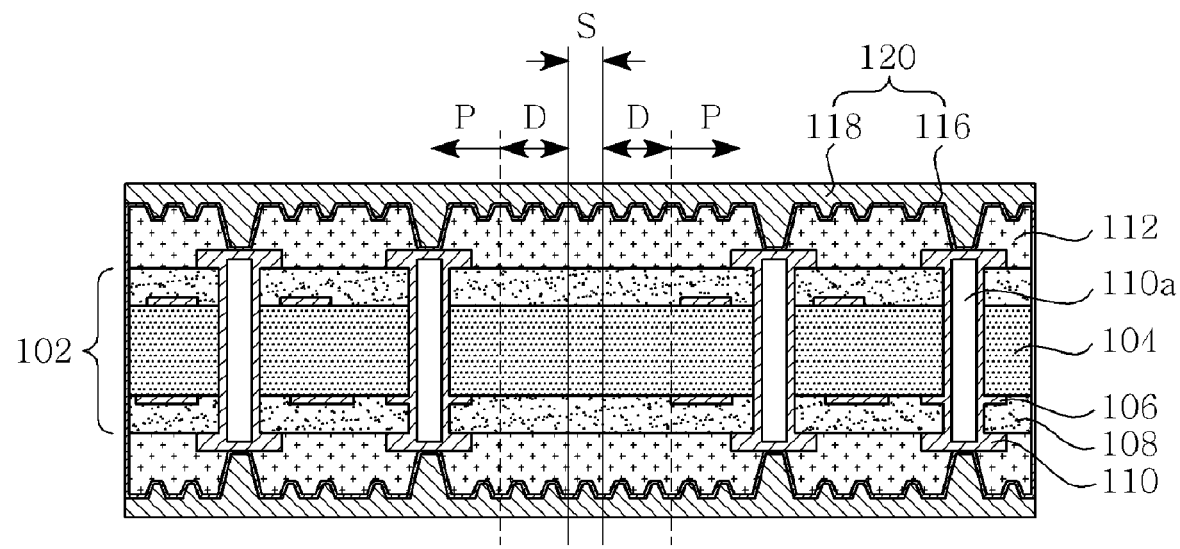

Thereafter, as shown in FIG. 16, electrolytic plating layers 118 are formed on the electroless plating layers 116 which are deposited on both the internal surfaces of the trenches 114a and 114b and the insulating layers 112. Hereinafter, the electroless plating layer 116 and the electrolytic plating layer 118 are collectively referred to as a plating layer 120 for the sake of providing a brief explanation.

At this time, the plating layers 120 are concurrently formed on the insulating layers 112 in the course of plating the internal surfaces of the trenches 114a and 114b.

Typically, there is an inevitable difference in plating between regions on the trenches 114a and 114b and regions on the insulating layers other than the trenches 114a and 114b. More specifically, since the plating layers 120 formed at the region on the trenches 114a and 114b are charged even in the inside of the trenches 114a and 114b, the portions of the plating layers 120 formed on the insulating layer regions other than the trenches 114a and 114b protrude upward higher than the portions of the plating layers 120 formed on the regions on the trenches 114a and 114b. In a conventional art, since the first trenches 114a are formed only on regions adapted to form circuit patterns and vias, there is a serious problem in that there is a considerable deviation of plating between the region on the first trenches 114a and the region on the insulating layer other than the first trenches 114a. In particular, because the trenches are not formed in the dummy region D positioned at the peripheral edge region of the product and the cutting region S along which adjacent substrate products are cut, an excessive amount of plating layer 120 is formed on the insulating layers 112, which requires a great deal of time to remove. Furthermore, there is another problem in that even the portions of the plating layers 120 positioned in the trenches 114a are concurrently removed in the course of removing the plating layers 120.

On the contrary, according to this embodiment of the present invention, the second trenches 114b are further formed in the dummy region D positioned at the peripheral edge region of the product and the cutting region S along which adjacent substrate products are cut, in order to improve on the plating deviation. In this context, since the trenches 114b are not limited to a specific shape unlike the circuit pattern and the vias, they may have various shapes, and a diameter and depth of the second trenches 114b and intervals between the second trenches 114b may be controlled in such a manner as to improve on the plating deviation. This will be described in greater detail in the subsequent text disclosed with reference to FIGS. 29a through 29d and FIGS. 30a through 330c.

Figure 17:
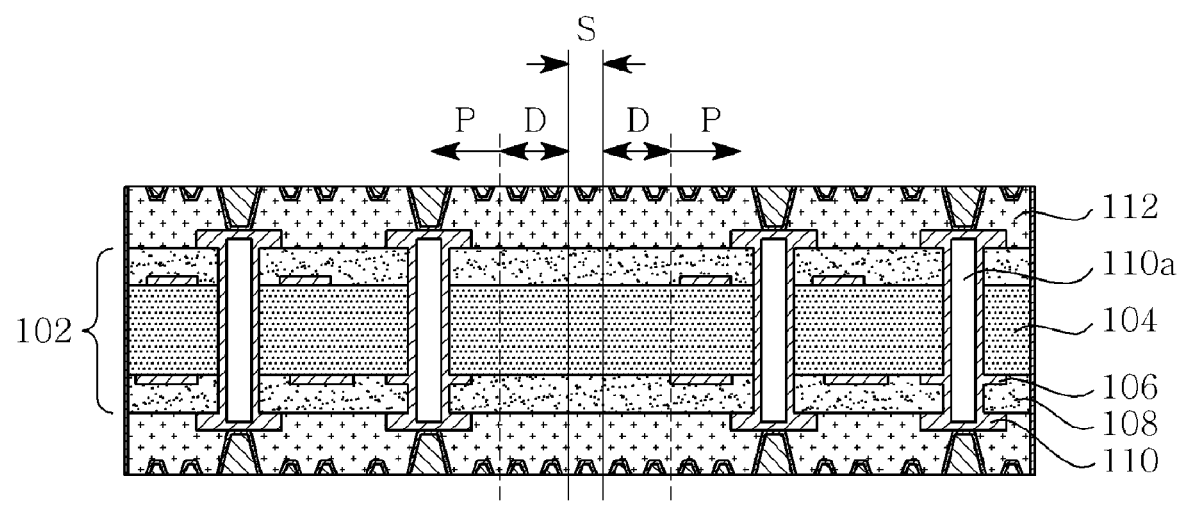

As shown in FIG. 17, the excessive plating layers 120 formed on the insulating layers 112 are removed through a polishing process, and thus the ground surfaces are flattened.

At this point, the polishing process may be conducted through various mechanical polishing methods including buff polishing, sand belt polishing or combinations thereof, chemical grinding, or chemical mechanical polishing. Alternatively, the polishing process may be conducted through a combination of mechanical polishing and chemical polishing.

In this regard, since the polishing process is conducted after the plating deviation is improved on using the second trenches 114b, it does not cause problems in which adjacent portions of the circuit pattern are not separated from each other or the circuit pattern is eliminated.

Figure 18:
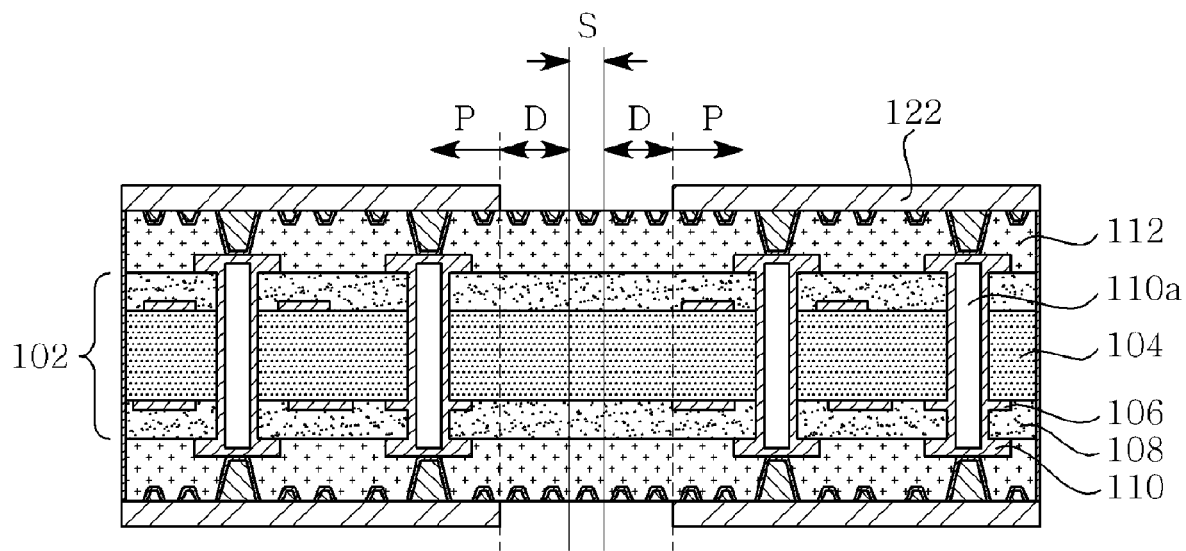

As shown in FIG. 18, etching resist 122 is applied onto the insulating layer 112 in the circuit region P. More specifically, the etching resist 122 is applied onto the insulating layer 112 such that the dummy region D positioned at the end region of the product and the cutting region S are exposed to the outside.

Figure 19:
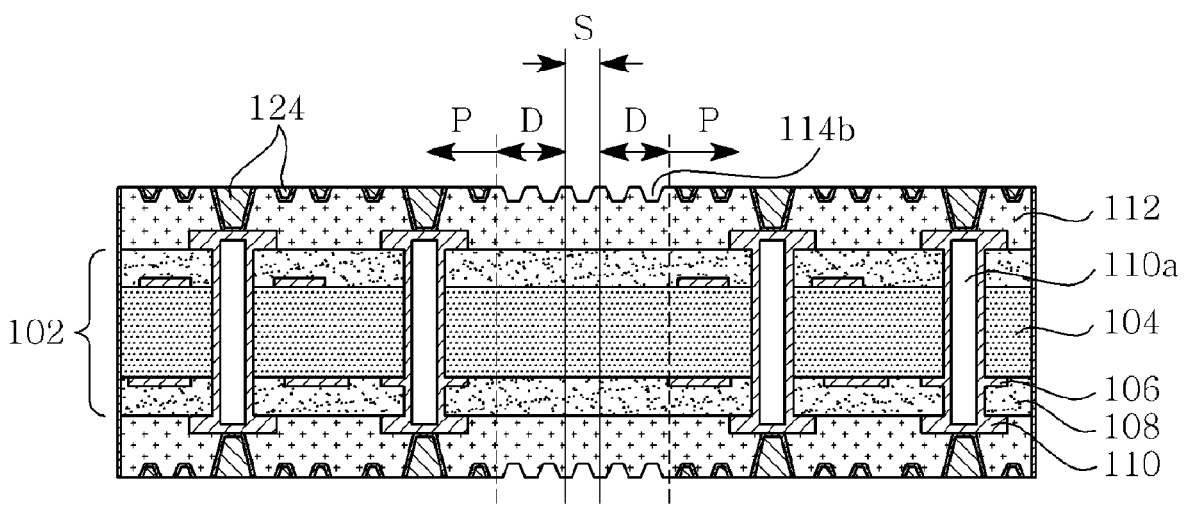

Thereafter, as shown in FIG. 19, the portions of the plating layers 120 charged in the second trenches 114b in the dummy region D and the cutting region S are removed using an etching process, and then the etching resist 122 is removed.

At this point, since the portions of the plating layers 120 formed in the second trenches 114b are removed, there is no increase of process load during a dicing process of separating the panel into unit substrates.

Figure 20:
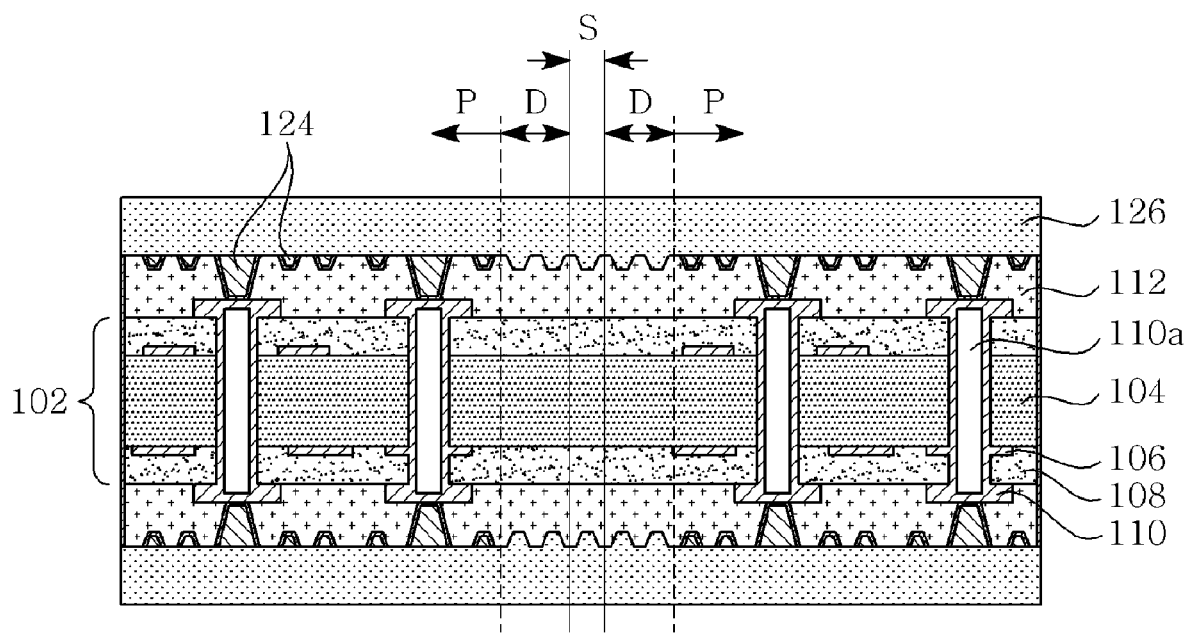

As shown in FIG. 20, outer insulating layers 126 are formed in both the second trenches 114 and on the insulating layer 112. At this time, because the outer insulating layers 126, which are in a semicured state, are applied to the insulating layer 112, the outer insulating layers 126 are introduced into spaces in the second trenches 114b. In this regard, the second trenches 114b serve to increase a contact area between the insulating layer 112 and the outer insulating layer 126 thus increasing adhesive force acting therebetween.

Figure 21:
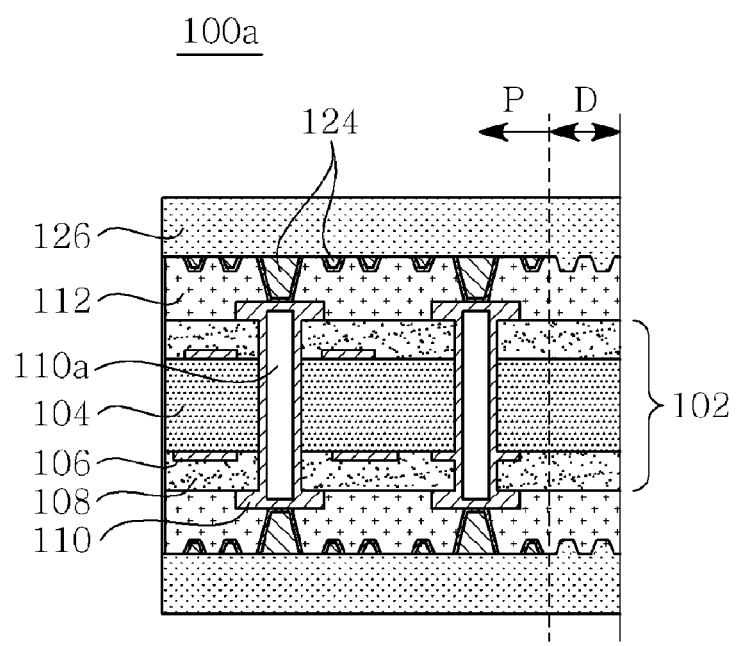

Finally, as shown in FIG. 21, a dicing process is conducted along the cutting region S so as to divide the panel into individual trench substrates 100a. Through the above-described sequential process, the trench substrate 100a shown in FIG. 11 is manufactured.

Process of Manufacturing the Trench Substrate (Second Embodiment)

FIGS. 22 through 30 are cross-sectional views sequentially showing a process of manufacturing a trench substrate according to a second embodiment of the present invention. The process of manufacturing a trench substrate according to this embodiment is executed in such a way that a circuit layer on one side of the trench substrate is created using an LPP while another circuit layer on the other side of the trench substrate is created using a typical circuit-forming process, and a plating layer formed in the second trenches during the formation of the circuit layer on the other side can be removed at one time. Hereinafter, the process of manufacturing the trench substrate according to the second embodiment of the present invention will be described with reference to FIGS. 22 though 30.

Figure 22:
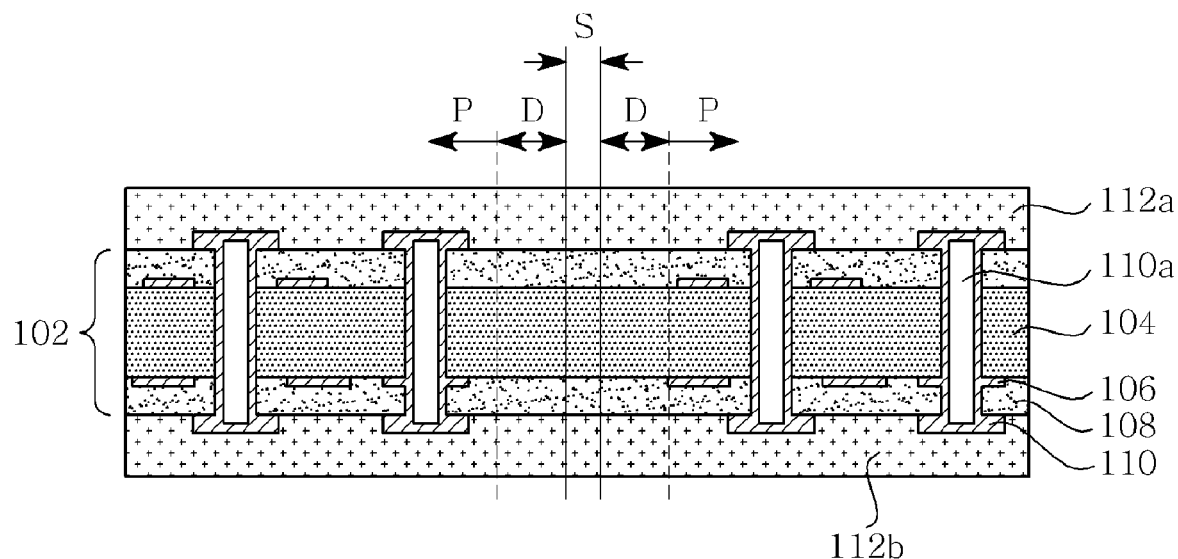
FIGS. 22 through 30 are cross-sectional views sequentially showing a process of manufacturing a trench substrate according to a second embodiment of the present invention.

As shown in FIG. 22, a first insulating layer 112a is formed on one side of a base substrate 102, and a second insulating layer 112b is formed on the other side of the base substrate 102.

Figure 23:
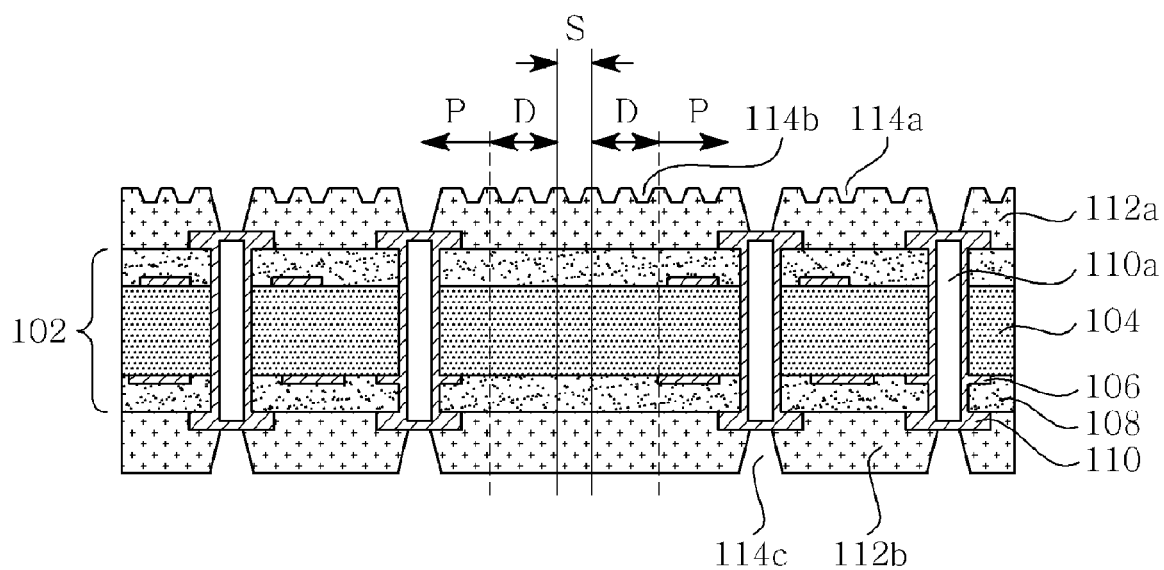

As shown in FIG. 23, trenches 114a and 114b are formed on the first insulating layer 112a formed on the base substrate 102 throughout a circuit region P, a dummy region D positioned at the edge region of the trench substrate product and a cutting region S, and via-holes 114c are formed in the second insulating layer 112b in the circuit layer P.

Figure 24:
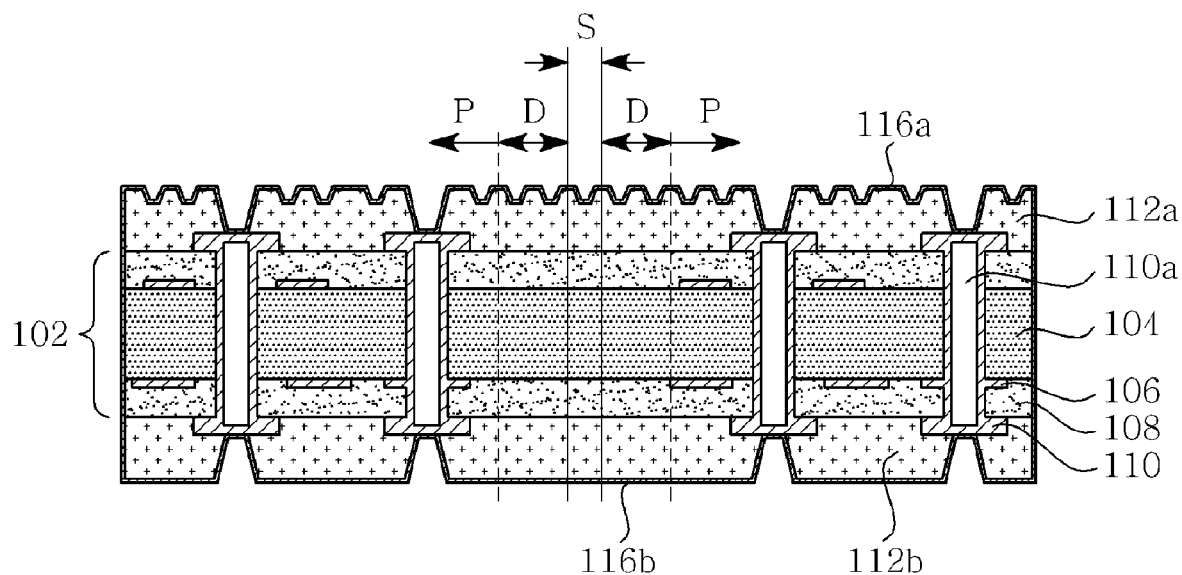

As shown in FIG. 24, a first electroless plating layer 116a is formed on both internal surfaces of the trenches 114a and 114b and the first insulating layer 112a, and a second electroless plating layer 116b is formed on both internal surfaces of the via-holes 114c and the second insulating layer 112b.

Figure 25:
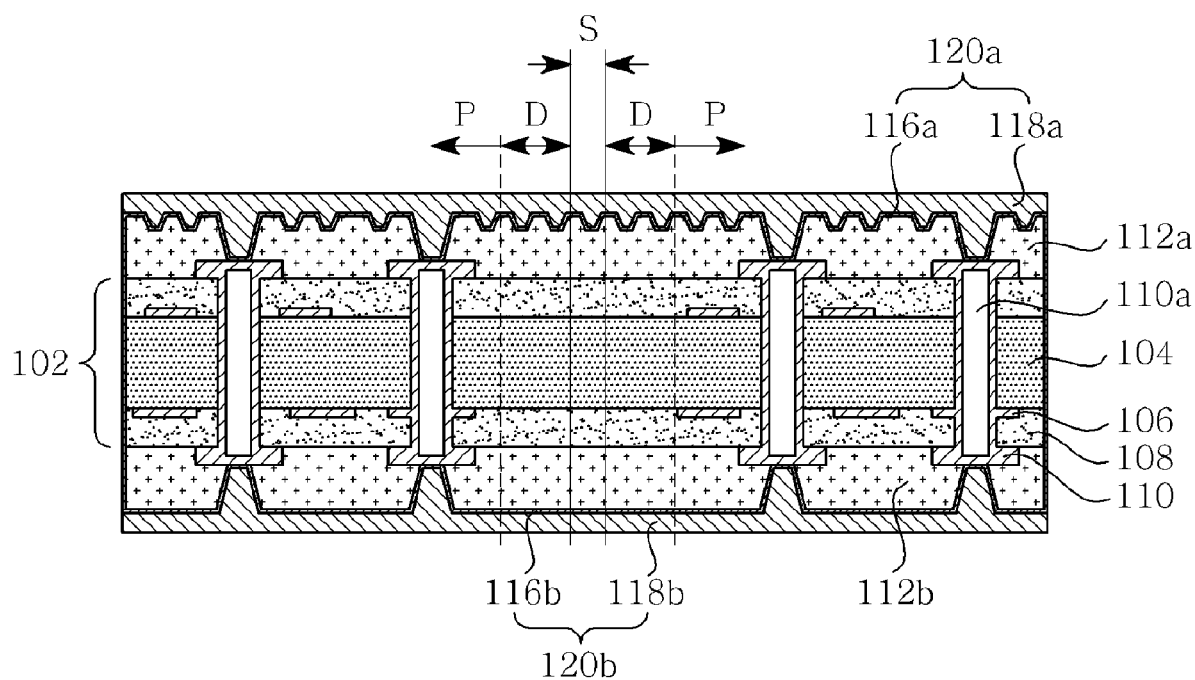

As shown in FIG. 25, a first electrolytic plating layer 118a is formed on both internal surfaces of the trenches 114a and 114b and the first electroless plating layer 116a, and a second electrolytic plating layer 118b is formed on both internal surfaces of the via-holes 114c and the second electroless plating layer 116b. In other words, a first plating layer 120a composed of the first electroless plating layer 116a and the first electrolytic plating layer 118a is formed on the first insulating layer 112a, and a second plating layer 120b composed of the second electroless plating layer 116b and the second electrolytic plating layer 118b is formed on the second insulating layer 112b.

Figure 26:
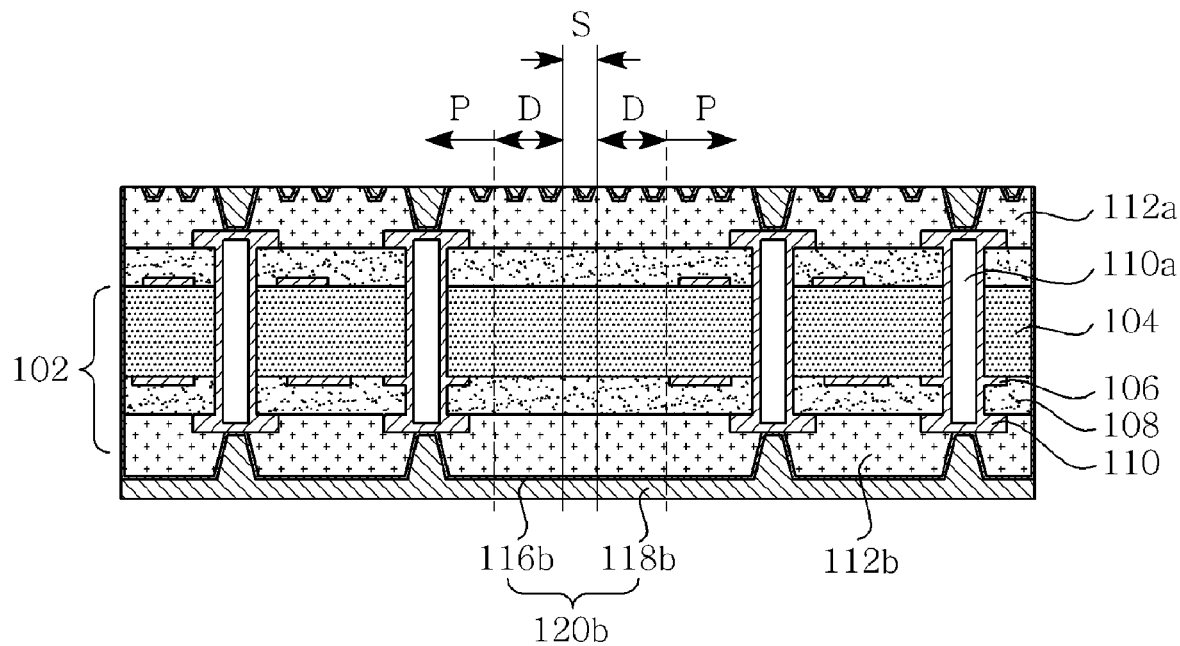

Subsequently, as shown in FIG. 26, the excessive first plating layer 120a formed on the first insulating layers 112a is removed through a polishing process, and thus the ground surfaces are flattened.

At this point, in consideration of a thickness of a second circuit layer 124b, the second plating layer 120b formed on the second insulating layer 112b may be partially removed widthwise.

Figure 27:
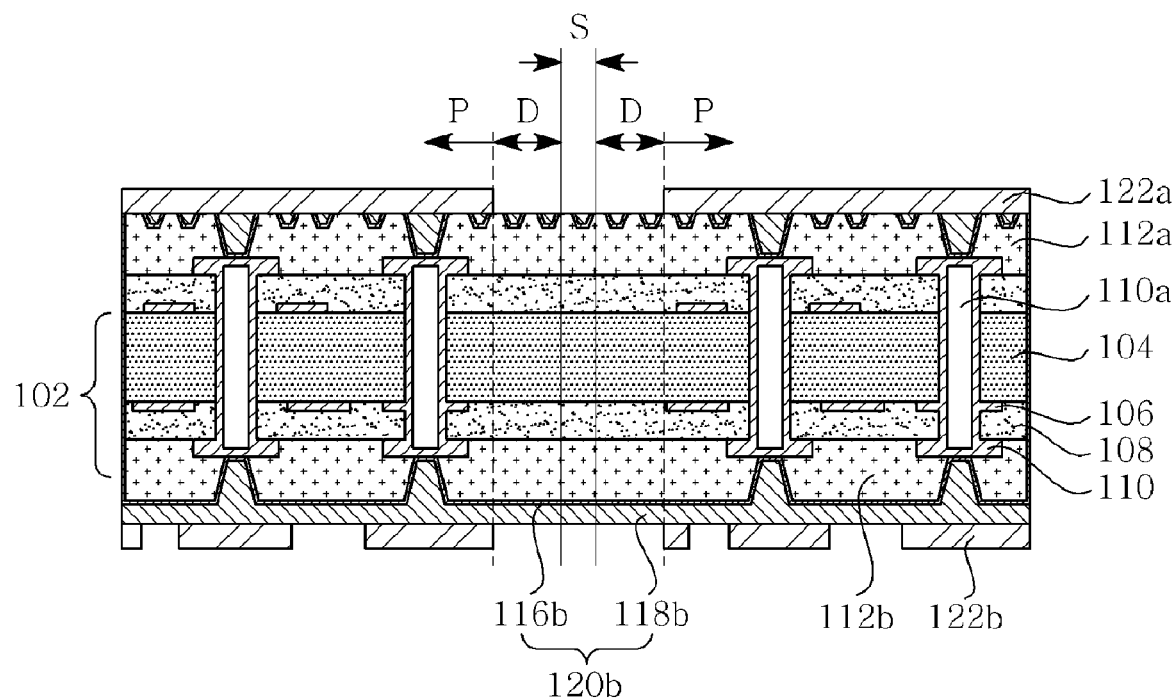

As shown in FIG. 27, a first etching resist 122a is applied to the first insulating layer 112a in the circuit region P, and a second etching resist 122b, which is patterned, is applied to the second insulating layer 112b. In this regard, the second etching resist 122b is patterned so as to have openings through which the second electrolytic layer 118b is exposed except for an area of the second circuit layer 124b.

Figure 28:
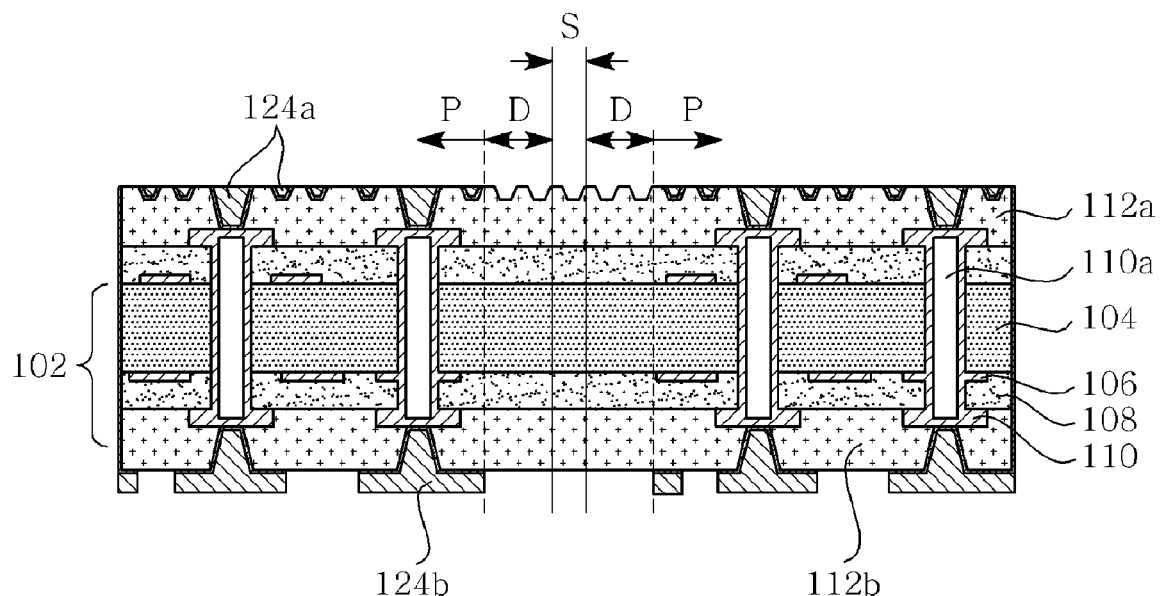

As shown in FIG. 28, the portions of the first plating layer 120a and the second plating layer 102b, which are not covered with the first etching resist 122a and the second etching resist 122b but are exposed to the outside, are removed, so that a first circuit layer 124a including the trench circuit pattern and trench vias is formed on the first insulating layer 112a while a second circuit layer 124b is formed on the second layer 112b.

In this regard, since the first plating layer 120a is concurrently removed during the etching process of forming the second circuit layer 124b, there is no need for an additional process of removing the first plating layer 120a formed in the second trenches 114b of the first insulating layer 112a in the dummy region D and the cutting region S, thus improving process efficiency.

Figure 29:
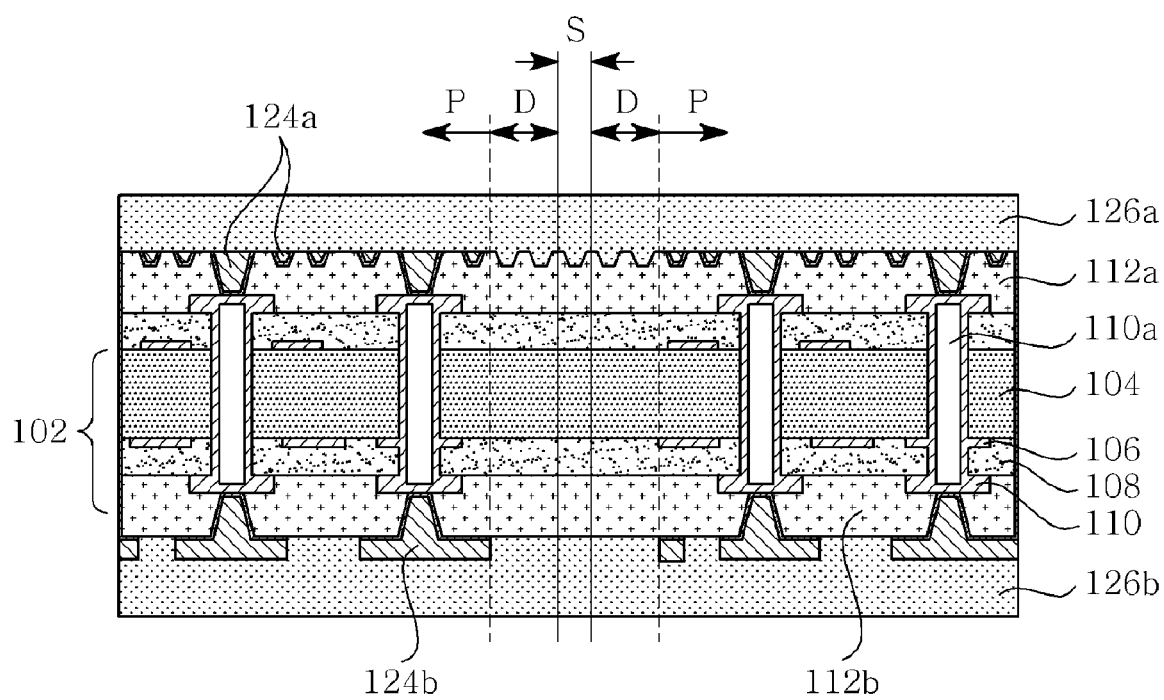

Subsequently, as shown in FIG. 29, a first outer insulating layer 126a is formed on both the second trenches 114b of the first insulating layer 112a and the first insulating layer 112a, and a second outer insulating layer 126b is formed on the second insulating layer 112b.

Figure 30:
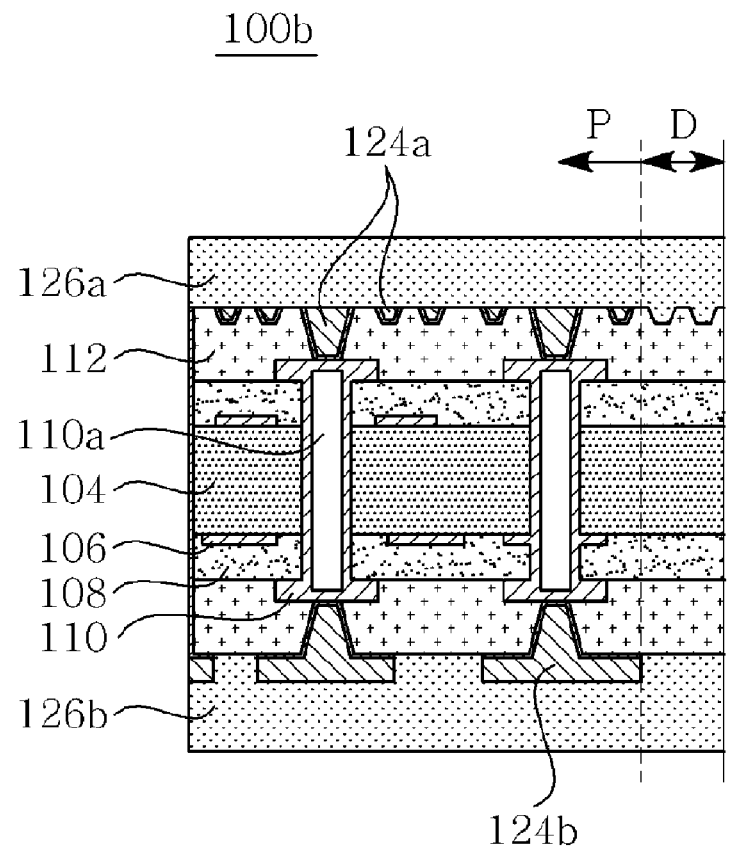

Finally, as shown in FIG. 30, a dicing process is conducted along the cutting region S so as to divide the panel into individual unit trench substrates 100b. Through the above-described sequential process, the trench substrate 100b shown in FIGS. 12 and 30 is manufactured.

FIGS. 31A through 31D are views showing shapes of trenches according to embodiments of the present invention. More specifically, the second trenches 114b, which are formed in the dummy region D positioned at the peripheral edge region of the product and the cutting region S positioned between the adjacent products other than the circuit region P, may have various shapes so as to improve on the plating deviation.

Figure 31A:
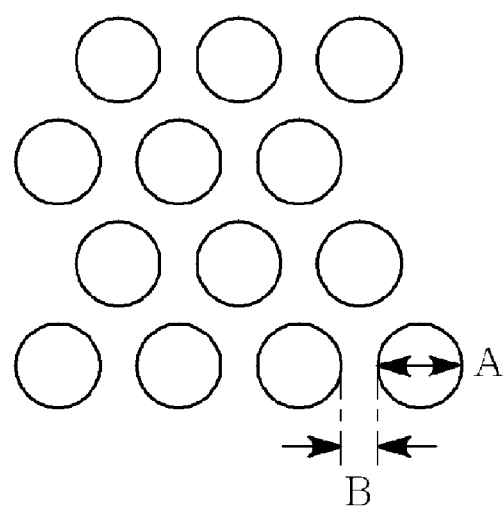
FIGS. 31A through 31D are views showing shapes of trenches according to embodiments of the present invention.
Figure 31B:
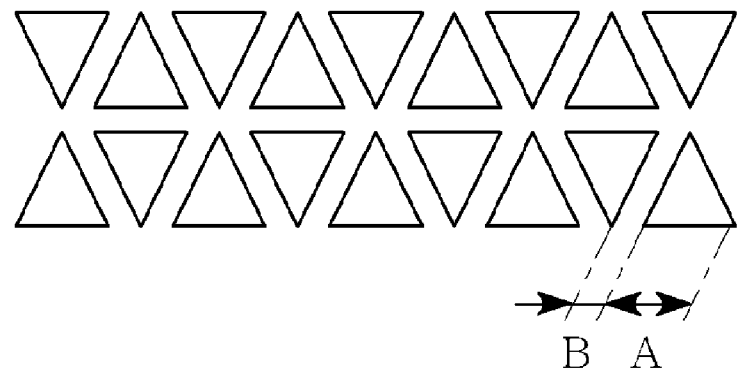
Figure 31C:
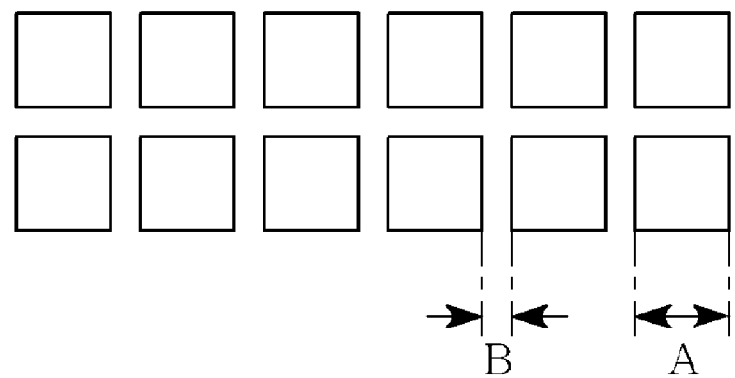
Figure 31D:
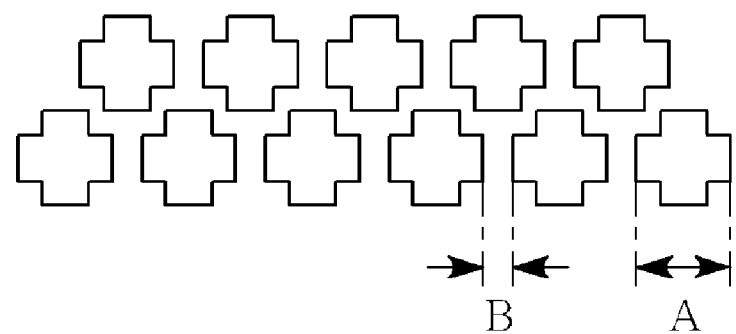

As shown in FIGS. 31A through 31D, the second trenches 114b according to embodiments of the present invention may have a circular shape (FIG. 31A), a triangular shape (FIG. 31B), a square shape (FIG. 31C) and a cross shape (FIG. 31D). Although not shown in the drawings, alternatively, the second trenches 114b may have other linear or polygonal shapes. In the drawings, characters A and B represent a diameter and an interval between trenches, respectively.

Table 1 below represents experimental data regarding plating deviation depending on a shape of the second trenches 114b. More specifically, Table 1 represents experimental data regarding deviation in plating thickness depending on a shape and an interval of the second trenches 114b when an area occupied by the circuit region is 80% of the total area, for example, when the second trenches 114b have a diameter A of 100 μm.

TABLE 1

| Test Nos. | Shape of trench | Interval between trenches (B)(μm) | Deviation in plating thickness |
|---|---|---|---|
| 1 | circular | 30 | 0.35 |
| 2 | triangular | 30 | 0.45 |
| 3 | square | 30 | 0.42 |
| 4 | cross | 30 | 0.68 |
| 5 | triangular | 20 | 0.53 |
| 6 | triangular | 40 | 0.48 |
| 7 | square | 20 | 0.40 |
| 8 | square | 40 | 0.65 |

From Table 1, it will be appreciated that the deviation in plating thickness is most improved in the case of circular trenches when intervals B between the trenches are a uniform 30 μm (See Test Nos. 1 to 4). Meanwhile, when a shape of the trenches is triangular, the deviation in plating thickness is most improved in the case where the interval B between the trenches is 30 μm from among 20 μm, 30 μm and 40 μm (See Test Nos. 2, 5 and 6). When a shape of the trenches is square, the deviation in plating thickness is most improved in the case where the interval B between the trenches is 20 μm from among 20 μm, 30 μm and 40 μm (See Test Nos. 3, 7 and 8).

Table 2 below represents experimental data regarding plating deviation depending on a diameter A, an interval B and a depth of the second trenches 114b when a shape of the trenches is circular. More specifically, Table 2 represents experimental data regarding deviation in plating thickness depending on a diameter A, an interval B and a depth of the second trenches 114b when an area occupied by the circuit region is 80% of the total area.

TABLE 2

| Test Nos. | Diameter of trench (A) (μm) | Interval between trenches (B) (μm) | Depth of trench (μm) | Deviation in plating thickness |
|---|---|---|---|---|
| 1 | X | X | X | 1.45 |
| 2 | 50 | 30 | 15 | 0.84 |
| 3 | 100 | 30 | 15 | 0.35 |
| 4 | 150 | 30 | 15 | 0.54 |
| 5 | 100 | 20 | 15 | 0.76 |
| 6 | 100 | 40 | 15 | 0.98 |
| 7 | 100 | 30 | 10 | 0.78 |
| 8 | 100 | 30 | 20 | 0.83 |

From Table 2, it will be appreciated that the deviation in plating thickness is more improved on in the case of having the second trenches 114b (See Test Nos. 2 through 8) than in the case of not having the second trenches 114b (See Test No. 1). When intervals B between the trenches and depths of the trenches are a uniform 30 μm and 15 μm, respectively, the deviation in plating thickness is most improved on in the case where the diameter A of the trenches is 100 μm from among 50 μm, 100 μm and 150 μm (See Test Nos. 2 through 4). When diameters A and depths of the trenches are a uniform 100 μm and 15 μm, respectively, the deviation in plating thickness is most improved in the case where the interval B between the trenches is 30 μm from among 20 μm, 30 μm and 40 μm (See Test Nos. 3, 5 and 6). Furthermore, When diameters A of the trenches and depths between the trenches are a uniform 100 μm and 30 μm, respectively, the deviation in plating thickness is most improved in the case where the depth of the trenches is 15 μm from among 10 μm, 15 μm and 20 μm (See Test Nos. 3, 7 and 8).

Figure 32A:
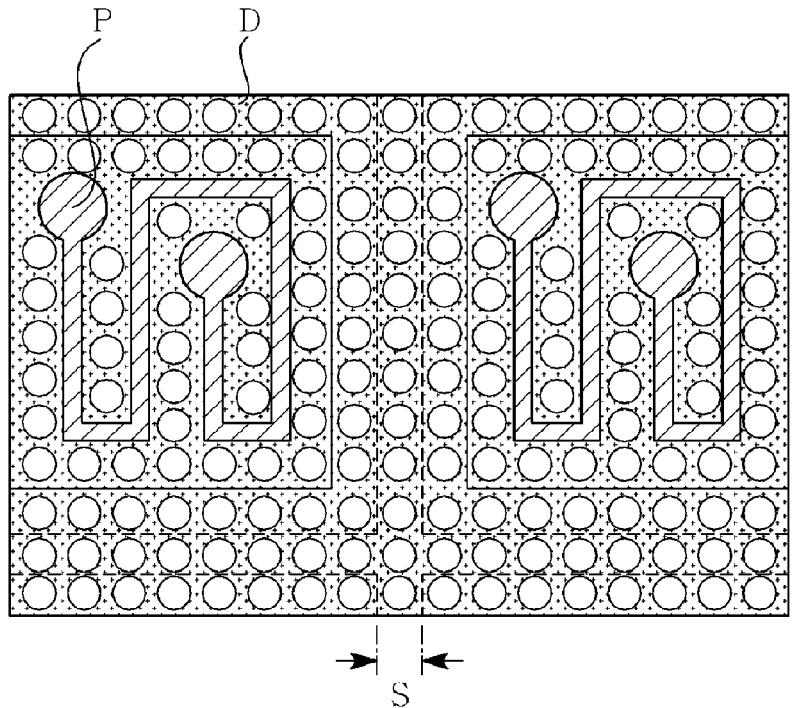
FIGS. 32A through 32C are views showing forming positions of the trenches according to embodiments of the present invention.
Figure 32B:
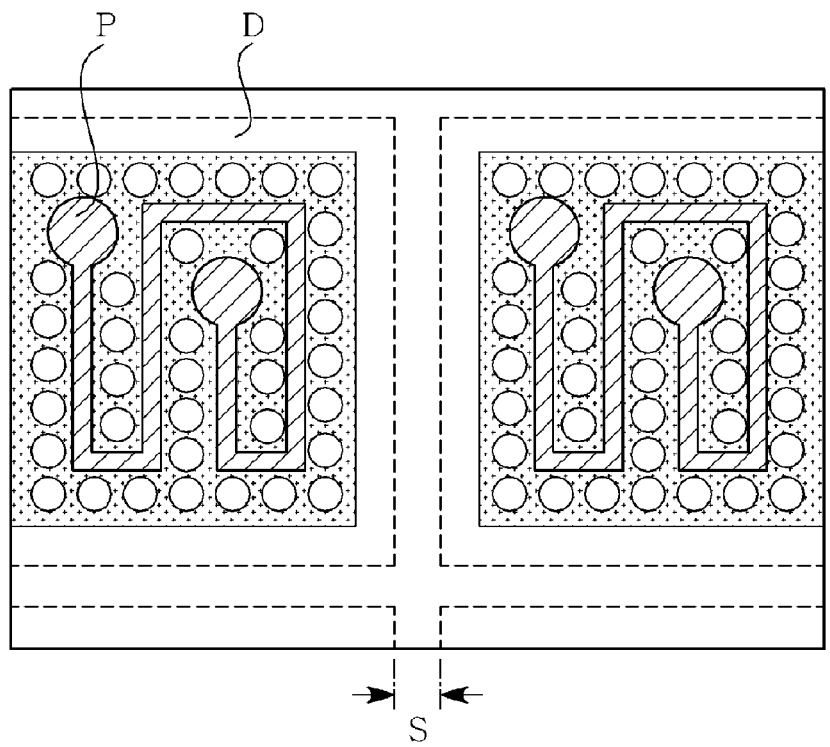
Figure 32C:
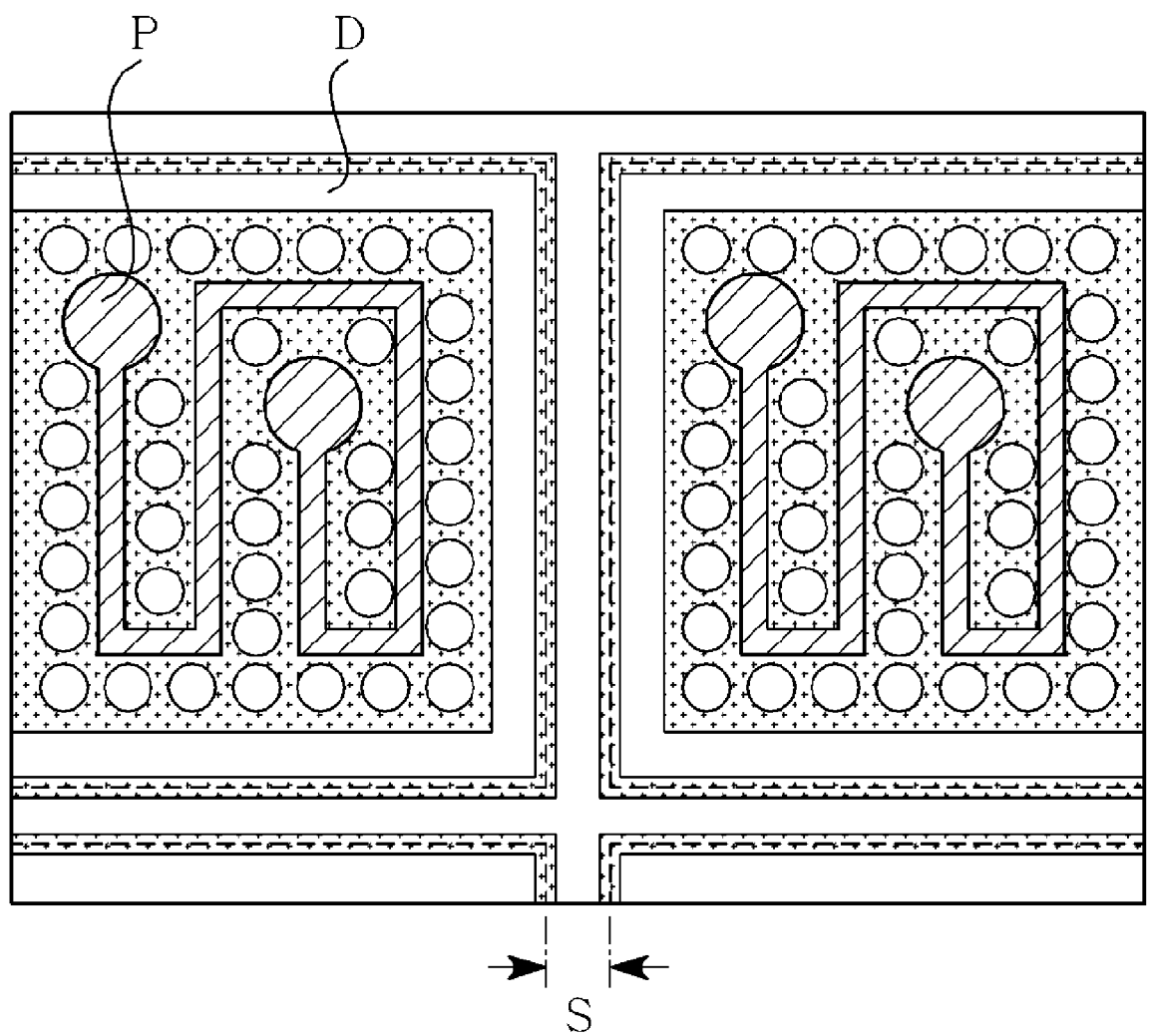

FIGS. 32A through 32C are views showing forming positions of the trenches according to embodiments of the present invention. Hereinafter, forming positions of the trenches according to embodiments of the present invention will be described with reference to FIGS. 32A through 32C.

As shown in FIGS. 32A through 32C, the second trenches 114b which are for the improvement of plating deviation may be formed at various positions. For example, the second trenches 114b may be formed at regions other than the circuit region P at a constant interval (See FIG. 32A), or may be formed at the region adjacent to the circuit region P at a constant interval while being thoroughly formed throughout the dummy region D and the cutting region S (See FIG. 32B). Alternatively, the second trenches 114b may be formed in the dummy region D and the cutting region S such that a boundary region between the dummy region D and the cutting region S remains so as to isolate the dummy region D and the cutting region S from each other (See FIG. 32C).

Meanwhile, the first trenches 114a positioned in the circuit region P may be formed at a predetermined interval so as to separate the circuit pattern from the ground.

As described above, according to the present invention, a plating process is conducted after trenches are formed in a circuit region in which a circuit pattern and vias are formed, a dummy region positioned at a peripheral edge region of the trench substrate, and a cutting region positioned between the adjacent substrates. As a result, deviation in plating thickness is improved on and a surplus portion of the plating layer formed on an insulating layer can be easily removed.

In addition, according to the present invention, trenches having various shapes are formed in the dummy region and the cutting region for the improvement of plating deviation.

Furthermore, according to the present invention, second trenches are formed on one side of a substrate in the dummy region and the cutting region so as to improve on plating deviation, and a plating layer formed in the second trenches are removed by a typical etching process used in the formation of a circuit on the other side. Consequently, there is no need for an additional process of forming the plating layer in the second trenches, and a load applied to a cutting tool during a process of cutting the substrate is reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A printed circuit board trench substrate comprising:
    a base substrate;
    an insulating layer formed on one side or both sides of the base substrate and including trenches formed in both a circuit region and a dummy region positioned at a peripheral edge of the trench substrate, said dummy region not having a circuit pattern; and
    a circuit layer formed in the trenches of the circuit region through a plating process and including a circuit pattern and vias.

2. The printed circuit board trench substrate according to claim 1, further comprising: an outer insulating layer formed both on the trenches formed in the dummy region positioned at the peripheral edge of the trench substrate and on the insulating layer.

3. The printed circuit board trench substrate according to claim 1, wherein the trenches formed in the dummy region positioned at the peripheral edge of the trench substrate have a linear shape, a circular shape, a triangular shape, a square shape, a cross shape or a polygonal shape.

4. The printed circuit board trench substrate according to claim 1, wherein the trenches formed in the dummy region positioned at the peripheral edge of the trench substrate are of an incised form with or without a protrusion therein.

5. A trench substrate comprising:
- a base substrate;
- a first insulating layer formed on one side of the base substrate and including trenches formed in both a circuit region and a dummy region positioned at a peripheral edge region of the trench substrate;
- a second insulating layer formed on the other side of the base substrate and including via-holes formed in the circuit region;
- a first circuit layer including a circuit pattern and vias, the circuit pattern and the vias being formed in the trench in the circuit region of the first insulating layer; and
- a second circuit layer including vias formed in the second insulating layer.

6. The trench substrate according to claim 5, further comprising:
- a first outer insulating layer formed both in the trenches formed in the dummy region positioned at the peripheral edge region of the trench substrate and on the first insulating layer; and
- a second outer insulating layer formed on the second insulating layer.

7. The trench substrate according to claim 5, wherein the trenches formed in the dummy region positioned at the peripheral edge of the trench substrate have a linear shape, a circular shape, a triangular shape, a square shape, a cross shape or a polygonal shape.

8. The trench substrate according to claim 5, wherein the trenches formed in the dummy region positioned at the peripheral edge of the trench substrate are of an incised form with or without a protrusion therein.

* * * * *